United States Patent [19]

Yamaguchi

[11] 4,440,840

[45] Apr. 3, 1984

[54] PHOTOGRAPHIC IMAGE-PROCESSING METHOD

[75] Inventor: Takashi Yamaguchi, Kawasaki, Japan

[73] Assignee: Toppan Printing Co., Ltd., Tokyo, Japan

[21] Appl. No.: 435,296

[22] Filed: Oct. 20, 1982

[51] Int. Cl.³ .................................................. G03F 9/00

[52] U.S. Cl. ............................................ 430/4; 430/5; 430/139; 430/152; 430/290; 430/396; 430/494

[58] Field of Search ........................ 430/4, 5, 139, 152, 430/290, 396, 494

[56] References Cited

U.S. PATENT DOCUMENTS

| | | | |
|---|---|---|---|
| 2,331,492 | 10/1943 | Michaclis | 430/396 |
| 2,543,706 | 2/1951 | Pohl | 430/396 |
| 3,667,948 | 6/1972 | Merriam | 430/396 |
| 3,775,119 | 11/1973 | Bemis | 430/5 |
| 4,241,153 | 12/1980 | Rovnjev | 430/396 |
| 4,321,321 | 3/1982 | Moore | 430/396 |

*Primary Examiner*—J. Travis Brown
*Attorney, Agent, or Firm*—Bacon & Thomas

[57] ABSTRACT

A photographic image-processing method which is capable of obtaining, from negative and positive films having an image whose density is in continuous gradation, a linear image representing the contour of that image. This method comprises the step of sandwiching a light scattering film between the negative and positive films in registration, thereby making a mask, and exposing a photographic paper to light at a right angle by way of the mask which is placed on the photographic paper, with a result that the light which passes through the light transmissive portion of the negative film is subjected to course alteration by the scattering film is order to pass through the light transmissive portion of the positive film, with a result that a linear contour image of the original image is formed on the photographic paper.

5 Claims, 3 Drawing Figures

PHOTOGRAPHIC IMAGE-PROCESSING METHOD

BACKGROUND OF THE INVENTION

This invention relates to a photographic image-processing method for subjecting an image to photographic enhancement in regard to the density information thereof.

Generally, it is necessary to enhance the density of an image having a continuous tone. In order to enhance the density a contour image consisting of an edge of a photographic image, i.e., a portion having a great difference in density is formed, or a contour image containing a few residual density portions therein is formed. The formation of such an image is utilized not only in the field of art, but also in the field of measuring concerning geological sectional maps, and distribution maps of plants, etc. This type of image processing can be performed electronically by using a photoelectric conversion device such as a flying-spot tube or the like. The electronic processing, however, has a drawback in that it requires expensive and complicated facilities. For this reason, a photographic process using a chemical treatment is generally employed. This photographic image-processing method includes, for example, a Tone Line Process described in Kodak Pamphlet No. Q-18, 66/10 published by Eastman Kodak Company. This process includes the following steps. (1) A positive film is made from a negative film having a continuous tone image. (2) The negative film is placed on the positive film in such a manner that their bases are facing each other and that their images are wholly in registration. In this step, the photosensitive emulsion layers of the films may also be arranged to face each other instead of the bases of the film. In the latter, a transparent film is sandwiched between the films. (3) The combined film unit obtained in step (2) is placed on a photosensitive sheet, such as a photographic film or paper, and the photosensitive sheet is exposed to oblique light by way of the film unit. The photosensitive sheet and light source are rotated relatively to each other to permit light to be obliquely irradiated onto the photosensitive sheet from all directions therearound. Since the images on the negative and positive films are wholly in registration, the combined film unit has a uniform density. For this reason, if the photosensitive sheet is exposed to light at a right angle, no image is formed on the photosensitive sheet. However, by exposing it to oblique light, a linear contour image is formed on the photosensitive sheet by way of the film unit. The relative rotation of the light source and photosensitive sheet eliminates the inconvenience of the oblique light being irradiated from only one direction which makes a contour of only one side of the image.

The above-mentioned prior art photographic image-processing method causes a variation in the linear image width unless the rotation is made on a uniform basis. However, the uniform rotation is difficult. Further, the linear image width is related to the angle of incidence of light with respect to the film unit and also to the thickness of the film or transparent film. This makes the setting of the linear image width difficult. Further, the prior art method enables only a linear image to be obtained, presenting difficulties in forming a contour image containing a few residual density portions therein.

There is another photographic image-processing method which is so called an "out-of-focus mask method". In this method, an out-of-focus positive film is formed by exposing a unit of positive film, negative film and transparent film sandwiched therebetween for scattering light. The positive film thus formed is placed on the negative film in registration to make a mask. A photosensitive sheet is exposed to light at a right angle by way of the mask. The contour image formed on the photosensitive sheet depends on the degree the mask is out of focus, so that the degree of contour enhancement is not anticipated unless the mask is formed. It is also difficult to form a mask, precisely.

SUMMARY OF THE INVENTION

Accordingly, the object of the invention is to provide a photographic image-processing method wherein various enhancement of an image in regard to density can be made by using an ordinary exposure apparatus without requiring any special exposure apparatus.

The above object can be achieved by a photographic image-processing method comprising the steps of making a positive transparent film and a negative transparent film, sandwiching a transparent diffusion film between the positive and negative films, the respective images of said films in registration thereby forming a mask and exposing a photosensitive sheet to an electromagnetic wave by way of the mask.

DETAILED DESCRIPTION OF THE PREFERRED EMBODIMENT

A photographic image-processing method according to an embodiment of the invention will be described with reference to the accompanying drawing. Reference is made to the principle of the present invention by using FIG. 1. A negative image wherein the reflection density of the original image and the transmission density of a formed image are in negative or reversed relationship from each other, and a positive image wherein both the densities are in positive relationship to each other, are formed on light transmissive media, respectively. Generally, use is made, of a negative film prepared by photographing an object and developing the resultant film (the film hereinafter means the post-development film unless otherwise particularly stated). With an unexposed photographic film contacted to this negative film, exposure and photographic treatment are effected, thereby obtaining a positive image. These negative and positive images are not limited to the silver halide type used in photography, but may be of any type as long as they use a transparent medium. For example, they may be of a type obtained by a coloring process such as that seen in pressure sensitive recording or thermal recording, or may be a type obtained by a colorant addition image-forming process such as that seen in a pressure-application printed matter, electronic printed matter, dyings, etc. prepared by physically cohering a coloring matter such as a pigment or dye onto the medium.

Figure 1:
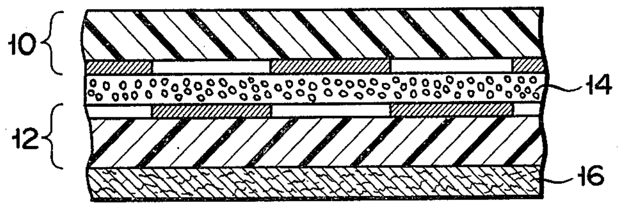
FIG. 1 is a sectional view showing the principle of a photographic image-processing method according to the present invention.
Figure 2:
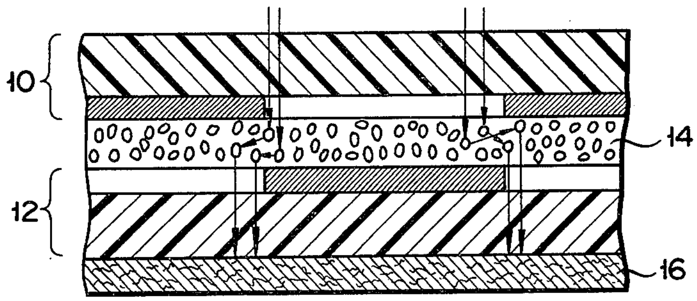
FIG. 2 is an enlarged view of FIG. 1.

A light scattering film 14 as a diffusion film is sandwiched between the negative film 10 and the positive film 12, thereby making a mask. Note here that in this case the negative image and the positive image should be wholly in registration with each other. In FIG. 1, the original image is an on-off pattern with white and black, assuming that the black portions of the photosensitive emulsion layer of the film indicate nontransparent section while the white portions thereof indicate transparent sections. In FIG. 1, the two films are positioned so that their photosensitive emulsion layers are facing each other. The positioning of the films is not limited to such, and the film bases may be facing each other or the photosensitive emulsion layers may be facing either upwards or downwards. The mask thus obtained is put on a photosensitive sheet 16. Then, exposure is performed by way of the resultant mask. Note here that a light source for this exposure may be installed right above the photosensitive sheet 16. This is because although the light-transmission density of the overlapped negative and positive images is uniform, light reaching the photosensitive sheet 16 acts as the oblique light owing to the light scattering film 14, as shown in an enlarged view of FIG. 2. That is, in the prior art method, the light irradiated on the photosensitive sheet passes through the light transparent portion of the negative film 10 but is obstructed by the nontransparent portion of the positive film 12. In contrast, according to the principle of the present invention, part of the light which passes through the light transparent portion of the negative film 10 is subjected to course variation by the light scattering film 14 and reaches the photosensitive sheet 16 through the light transparent portion (corresponding to the nontransparent portion of the negative film 10) of the positive film 12. The amount of light reaching the photosensitive sheet 16 is the greatest at the outer periphery of the nontransparent portion (image-formed portion) of the positive film 12 (corresponding to the inner periphery of the negative image). For this reason, a linear contour image of the outer periphery of the positive image is formed on the photosensitive sheet 16. When the negative film is interchanged in position with the positive film, a linear contour image of the outer periphery of the negative image is obtained. That is, according to the position of both the films, the linear contour image is varied, that is, either the outside-periphery contour or the inner periphery contour is obtained. Further, the width of the line can be controlled by varing the amount of exposure and the developing time period, but even if these are fixed, the width can easily be controlled by varying the scattering coefficient of the light scattering film 14. That is, when a light scattering film 14 having a low scattering coefficient is used, the amount of light which bypasses the image-formed portion of the positive film 12 and reaches the photosensitive sheet 16 is small, with the result that the line width becomes narrow. On the contrary, in the case where the scattering coefficient is great, it is easy to obtain a thick line image. Furthermore, in that case, the density of the formed-image is gradually changed towards the inside of the contour. The density graduation is controlled by the sensitivity of the photosensitive sheet 16 or various factors for development. The foregoing explanation has referred to the on-off pattern with white and black but can apply also to a general image of continuous tone.

Next, an example constituting a detailed embodiment of the invention is. shown. An on-off pattern was used as an object. This object was photographed by using a Kodak separation negative film, type 1, 4131 to make the negative film 10. From this negative film 10, a positive film 12 was made by contact exposing. The transmission densities of the white and black portions of the negative film 10 were 1.82 and 0.02, respectively. The transmission densities of the white and black portions of the positive film 12 were 0.02 and 1.79, respectively. These transmission densities were measured by a densitometer such as a Macbeth TD-504. Accordingly, the transmission densities when both the films are overlapped with each other were 1.84 and 1.81, respectively, in regard to the portions corresponding to the white and black portions of the negative film.

A Kalver film which is a vesicular film made by Kalver Corp. was used as for the light scattering film 14 to be sandwiched between the two films. Using a Sharp Printer (manufactured by Takahashi Precision Machine Factory, Type Tz) as the exposure apparatus and using a high pressure mercury lamp (Type G-MERC-750A) as the light source, the following five kinds of scattering films were prepared while varying the exposure conditions.

(1) Exposure period; 30 seconds, without thermal development, and Density range; 0.09 to 0.19
(2) Exposure period; 2 seconds, with thermal development, and Density range; 0.09 to 0.195
(3) Exposure period; 4 seconds, with thermal development, and Density range; 0.2 to 0.45
(4) Exposure period; 8 seconds, with thermal development, and Density range; 0.3 to 0.6, and
(5) Exposure period; 30 seconds, with thermal development, and Density range; 0.35 to 0.675

The above density was measured using the Macbeth densitometer equipped with a Kodak filter UV-106. The diffusion density was measured with respect to visible light. The thermal development was performed at 120° C. by using a Canon/Kalver developer for 1 second. The photosensitive sheet 16 was made of a silver halide printing paper F-4 manufactured by Oriental Photo Ind. Co., Ltd. Developing processing for the printing paper 16 was carried out using a developer and a fixer manufactured by Kodak Co. The development was carried out for 90 seconds at 19° to 21° C., the fixation for 5 minutes at 19° to 21° C., and the washing for 10 minutes.

As a first example, for the purpose of confirming the drawbacks of the prior art photographic image-processing method, the negative film was placed on the photographic paper with the positive film sandwiched therebetween and exposure was carried out for 10 seconds from directly above the negative film. For the exposure apparatus, use was made of a "Lucky" 60M-C enlarger manufactured by Fujimoto Photographic Industry Co. Ltd. and the light emitted from a halogen lamp of 12V-5W built in that enlarger was irradiated as the diffused light onto the printing paper through a frosted glass. Next, the vesicular film under each of the conditions (1) to (5) was interposed between the negative and positive films so that its foamed surface may be on the lower side, i.e., may be on the positive-film side. Under this condition exposure was performed. As seen in FIG. 1, the emulsion layers of the negative film 10 and positive film 12 were facing each other. The exposure was carried out for 10 seconds at an illuminance of 9.6 lux. Measurements of the illuminance were made using a photocell illuminometer (TOPCON, SPI-6A). When the vesicular film (1) above was used, the scattering film 14 only served as a mere spacer and no linear image was obtained. When the vesicular films (2) to (5) above were interposed, in each case a linear image was obtained at the boundary portion between the white and black images. In the case of using the same kind of vesicular film, the longer the exposing period of time, the thicker the linear image. Under the same exposure conditions, the greater scattering coefficient the vesicular film has, the thicker the linear image. And the smaller the coefficient of the vesicular film, the thinner the linear image.

As a second example, an experiment was carried out in the same manner as in the first experiment but under different exposure conditions. The light intensity was made 30 lux corresponding to three times as high as that used in the first example, and this exposure was carried out for 10 seconds. When the films (2) to (5) were used, in each case a linear image was obtained at the boundary portion between the white and black images and a slight tone appeared in the image portion with the result that the density information corresponding to a density difference of 0.03 was obtained between the white and black images. In the first experiment, the black image portion had a density of 0 and the difference in density between the white and black image portions was also zero. The second experiment showed that it is possible with the photographic image-processing method of the present invention to obtain an image practically unobtainable using the prior art method because of the residual tone left within the image contour and the high tone around the boundary. This type of image processing has heretofore been realized only on an electronic basis.

In a third example, the experiment was performed under the same exposure conditions as in the second example, but with the positional relation between the negative and positive films reversed from that in the second example, i.e., with the positive films put on the negative. In this example, opposite to the result obtained in the second example, an image was obtained in which whiteness remained, the blackness was decreased and the contour was enhanced. According to the above three examples, desirable results are obtained when the processing is performed in regard to an image sent from the LANDSAT satellite.

The above explanation has been made of the cases where the light scattering films were used as the diffusion layer. Other examples wherein the scattering film serves as the diffusion film include a semitransparent carbon photograph, nontransparent PVC film, $TiO_2$-dispersed resin film, commercially available semitransparent polyethylene film (double-sheets), frosted glass (it has been experimentally proven that it is preferable to position the frosted face downwardly since the resultant tone is increased). In these uses, equivalent results to those obtained by the use of the Kalver films were obtained. Further, a refractive layer other than the scattering layer may be used as the diffusion layer. The refractive layer has a property to turn the passing direction of the exposure light beams to a specified direction. It is a type wherein irregularities are regularly formed on the surface of a thermoplastic transparent plastic sheet and which includes, for example, a lenticular lens sheet, a Fresnel lens sheet, a Honeycomb lens sheet, etc.

Further, a luminescence layer capable of emitting a fluorescence or phosphorescence may be used as the diffusion layer. That is, since the fluorescence or phosphorescence emitted from such a luminescence layer travels in random directions, it is possible to use the luminescence layer as the diffusion layer. In this case, it is necessary to select and use a photosensitive material having a sensitivity which matches the wavelength of such fluorescence or phosphorescence. The type of the exposure light is not limited to visible lights but may be electromagnetic waves such as infrared rays, ultraviolet rays, X rays, or $\gamma$ rays. In the case of using these rays as the exposure lights, it is necessary to selectively use the photosensitive material according to the type of the exposure light.

Figure 3:
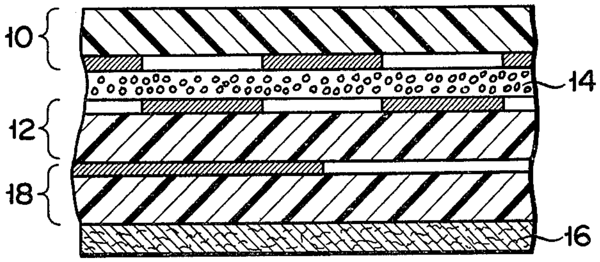
FIG. 3 is a sectional view showing a modification of the photographic image-processing method according to the present invention.

Next, a modification of the invention will be described with reference to FIG. 3. This modification is the same as in case of FIG. 1 in that the negative film 10 and the positive film 12 are overlapped with the light scattering film 14 interposed therebetween but differs from the case of FIG. 1 in that a film 18 having the second information is additionally interposed between the positive film 12 and the photosensitive paper 16. Therefore, in this modification there is obtained an image prepared by subtracting the second image from the original image. The position in which to place this sub-film 18 is not limited to the intermediate position. For example, the second image may be formed in the light scattering 14.

As has been described above, according to the present invention, by using a mask prepared by overlapping the negative and positive films the mask exposes the light at right angle, the light intensity is not uniform on the photosensitive sheet, thereby obtaining a linear image, that is to say, a contour image with high contrast. The degree of enhancement of the contour image, that is, the thickness of the linear image can be easily varied by varying the diffusion coefficient of the diffusion layer. That is, the present invention can provide a photographic image-processing method which is simple and easily adjustable as compared with the prior art photographic image-processing method.

What is claimed is:

1. A photographic image-processing method to obtain a contour image comprising the steps of:

making positive and negative transparent films;

laying up the positive and negative films with a transparent diffusion film therebetween and with the images of the positive and negative films in registration thereby forming a mask; and exposing a photosensitive sheet to electro-magnetic waves from above by way of the mask which is placed on the photosensitive sheet.

2. A method according to claim 1, in which said diffusion film is a light scattering film.

3. A method according to claim 1, in which said diffusion film is a light refractive film.

4. A method according to claim 1, in which said diffusion film is a fluorescent material film which, upon receiving light which is selectively transmitted through and absorbed by one of said positive and negative films, emits fluorescence which is selectively transmitted through and absorbed by the other of said positive and negative films.

5. A method according to claim 1, in which said diffusion film is a phosphorescent material film which, upon receiving light which is selectively transmitted through and absorbed by one of said positive and negative films, emits phosphorescence which is selectively transmitted through and absorbed by the other of said positive and negative films.

* * * * *